(12) United States Patent
Nagatsuka et al.

(10) Patent No.: US 6,204,681 B1
(45) Date of Patent: Mar. 20, 2001

(54) IC DEVICE CONTACTOR

(75) Inventors: Hideaki Nagatsuka; Hideyuki Takeuchi, both of Honji; Makoto Fukushima, Yorii-machi, all of (JP)

(73) Assignee: Hitachi Electronics Engineering Co., Ltd., Tokyo (JP)

( * ) Notice: Subject to any disclaimer, the term of this patent is extended or adjusted under 35 U.S.C. 154(b) by 0 days.

(21) Appl. No.: 09/225,242

(22) Filed: Jan. 4, 1999

(30) Foreign Application Priority Data

Jan. 14, 1998 (JP) .................................................. 10-017663

(51) Int. Cl.[7] .................................................. G01R 31/02
(52) U.S. Cl. .................. 324/761; 324/754; 324/755; 439/91
(58) Field of Search ..................................... 324/761, 757, 324/751, 754, 758, 765; 439/91, 100

(56) References Cited

U.S. PATENT DOCUMENTS 5,766,979 * 6/1998 Budnaitis ........................ 438/15
5,838,160 * 11/1998 Beaman et al. ................... 324/754
5,955,888 * 9/1999 Frederickson et al. ........... 324/761

* cited by examiner

Primary Examiner—Safet Metjahic
Assistant Examiner—Minh Tang
(74) Attorney, Agent, or Firm—Oblon, Spivak, McClelland, Maier & Neustadt, P.C.

(57) ABSTRACT

An IC device contactor for electrically connecting IC devices each having a large number of spherical electrodes on one side of a substrate to an IC tester head for a test of electrical properties or characteristics. The IC device contactor includes: a socket board having a predetermined number of contact points formed on a surface thereof; an anisotropic conductive sheet having a multitude of fine conductive wires embedded in the insulating sheet in an angularly oriented state; a tip holder perforated with a predetermined number of apertures; and a predetermined number of contact tips fitted in the apertures of the tip holder for contact with the spherical electrodes of the IC devices. The anisotropic conductive sheet is disposed with its side in engagement with the socket board and the other side in engagement with the contact tips to electrically connect the contact tips with the contact points on the socket board. The contact tips are assembled with the tip holder in such a way as to be securely retained in position within the respective aperture and are brought into pressed contact with the anisotropic conductive sheet at one end while the other end of the contact tips is projected out of the aperture by a predetermined length.

6 Claims, 6 Drawing Sheets

F I G. 2
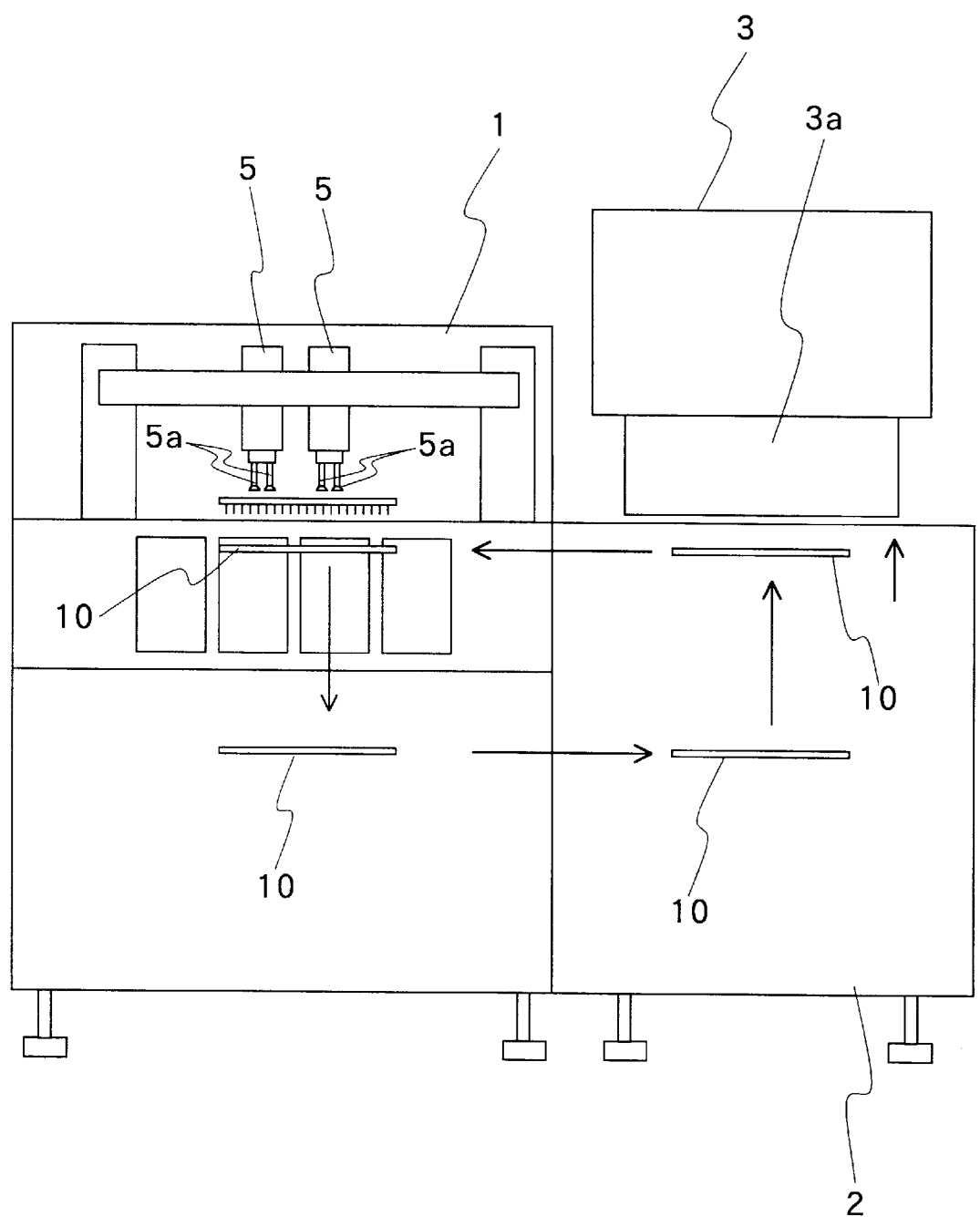

IC DEVICE CONTACTOR

BACKGROUND OF THE INVENTION

1. Field of the Art

This invention relates to an IC device contactor to be used with an IC test machine for electrically connecting thereto spherical electrodes of IC devices, for example, of CSP (chip scale package) type or of BDA (ball grid) type for a test of electrical properties or characteristics.

2. Prior Art

IC devices consist of an LSI (large scale circuit) chip with a predetermined number of electrodes. LSI chip are provided as packages shielded in a synthetic resin material. Connected to a large number of electrodes on an LSI chip are lead pins which are generally led out on one side of a package. Lately, however, to comply with demands for IC devices of smaller sizes, there have been developed and put in use IC packages which are reduced almost to the size of an LSI chip and provided with a large number of electrodes substantially of hemispherical shape like solder balls or electrodes of spherical shape arranged in a matrix on a surface on one side of a package instead of lead pins. The packages of this sort are called CSP or BGA and, since they require only a small mounting space on a printed circuit board, have found wide applications in mobile type electronic appliances, for example, such as handy video cameras, mobile or cellular phones, notebook type personal computers etc, contributing to downsizing these electronic appliances to more compact forms.

In testing or measuring electrical properties of the aforementioned CSP and BGA type IC devices in a post-production stage, each IC device package is connected to an IC tester by the use of contact probes which are electrically connected to the respective spherical electrodes of IC devices. For this purpose, usually mounted on the IC tester is a socket board which has the same number of contact elements as the spherical electrodes on the part of IC devices to serve as part of a contacting mechanism for IC devices under test. During a test, IC device are pressed against the socket board, thereby to electrically connect the contact elements on the side of the IC tester to the spherical electrodes on the side of the IC device.

In this connection, the electrode on an IC device is formed in a fine pitch matrix within a small surface area of square shape. For example, more than 150 minute electrodes are arranged in a matrix within a small surface area of several $cm^2$. Besides, since the electrodes of IC devices are spherical in shape, difficulties are often encountered in maintaining stable electrical connections with the contact elements on the side of the socket board for all of the electrodes. Especially in case the spherical electrodes on an IC device is formed by solder balls, their surfaces tend to be oxidized and covered with an oxidation film which would increase the possibilities of contact failures all the more.

Therefore, instead of bringing electrodes on the part of a socket board directly into contact with electrodes of IC devices, it has been the general practice to interpose an anisotropic conductive sheet between a socket board and each IC device to be tested. The anisotropic conductive sheet is constituted by a sheet of resilient material and of a predetermined thickness, for example, by an insulating sheet of silicon rubber and fine conductive wires of a metal such as fine gold-plated brass wires which are embedded in the silicon rubber sheet. The fine conductive wires are extended from one side to the other of the insulating sheet in an angularly oriented state, and the opposite ends of the wires are exposed in the surfaces on the opposite side of the insulating sheet. As the anisotropic conductive sheet is interposed and pressed against the socket board, the embedded fine conductive wires are electrically connected to the contact elements on the socket board. In this regard, in order to maintain electrical connections between the contact elements and fine conductive wires in a securer manner, each electrode should desirably be contacted by a plural number of fine conductive wires of the anisotropic conductive sheet. Accordingly, when IC devices are set in contacting positions, the spherical electrodes are located in offset positions relative to the contact elements on the side of the socket board, and, according to the degree of angular orientation, fine conductive wires in the anisotropic conductive sheet can provide an increased contacting length to ensure securer electrical connections between the IC device and the socket board.

In an IC device test, it is the anisotropic conductive sheet that is directly contacted by the spherical electrodes of IC devices. Namely, it is the anisotropic conductive sheet that receives impacts repeatedly by connections of IC devices. In addition, in order to test electrical properties of IC devices efficiently, it has been the general practice to test a plural number of IC devices simultaneously, for example, to set as large as 16, 32 or 64 IC devices on a test board and to press the test board against a socket board. Therefore, an extremely large number of electrodes have to be connected at once, by applying a strong compressive force to ensure that all of the electrodes are connected without failures. Due to repeated contact with IC device electrodes under compressive force, the anisotropic conductive sheet of this sort always has a problem of getting worn out or deteriorated prematurely.

Further, the spherical electrodes on IC devices are of a soft metal like solder balls which can be scraped off quite easily when pressed against an anisotropic conductive sheet for contact therewith and may deposit on the latter as solder debris. Contact failures may result from such solder debris short circuiting the fine conductive wires. Especially, since fine conductive wires are provided in a high density on the entire surfaces of the anisotropic conductive sheet, short circuiting across adjacently located solder balls is very likely to occur upon connecting IC devices to an anisotropic conductive sheet on which a large amount of solder debris has deposited. Further, when mounting an IC device of this sort on a wiring board, its spherical electrodes are connected to electrodes on the side of the wiring board after being softened or fused by application of heat. From the standpoint of ensuring stability of electrical connections of the electrodes of IC device mounted on a wiring board, the apex portions of the spherical electrodes should preferably be maintained perfectly in a spherical shape. Nevertheless, there has been a problem that the apex portions of the spherical electrodes can be damaged to a material degree if abutted directly against fine conductive wires of an anisotropic conductive sheet.

SUMMARY OF THE INVENTION

In view of the foregoing situations, it is an object of the present invention to provide an IC device contactor of the type employing an anisotropic conductive sheet, which can prevent premature deteriorations of the anisotropic conductive sheet by keeping soft spherical electrodes of IC devices from directly contacting the anisotropic conductive sheet.

It is another object of the present invention to provide an IC device contactor which is suitable for use in simultaneously testing a large number of IC devices and which can electrically connect the IC devices securely to a socket board by application of a relatively small pressure.

It is still another object of the present invention to provide an IC device contactor which can protect against damages at least apex portions of spherical electrodes of IC devices under test.

In accordance with the present invention, the above-stated objectives are achieved by the provision of an IC device contactor to be used for electrically connecting IC devices each having a large number of spherical electrodes on one side of a substrate to an IC tester head for a test of electrical properties or characteristics. The IC device contactor according to the present invention essentially includes: a socket board having a predetermined number of contact points formed on a surface thereof; an anisotropic conductive sheet constituted by a resilient insulating sheet, and a multitude of fine conductive wires embedded in the insulating sheet with predetermined angular orientation across the thickness of the insulating sheet, opposite ends of the fine conductive wires being exposed in surfaces on front and rear sides of the insulating sheet; a tip holder in the form of an insulating plate perforated with a predetermined number of apertures; and a predetermined number of contact tips made of a conducting material and fitted in the apertures of the tip holder for contact with the spherical electrodes of the IC devices; the anisotropic conductive sheet having one side thereof in engagement with the socket board and the other side in engagement with the contact tips to electrically connect the contact tips with the contact points on the socket board; and the contact tips being assembled with the tip holder in such a way as to be securely retained in position within the respective aperture and being brought into pressed contact with the anisotropic conductive sheet at one end while the other end of the contact tips is projected out of the aperture by a predetermined length on the side away from the anisotropic conductive sheet.

As for a more particular form of the contact tips, for example, each contact tip may be comprised of an electrode portion to be abutted against at least one of fine conductive wires in the anisotropic conductive sheet, a contacting portion projected out of an aperture of the tip holder for engagement with a spherical electrode of IC device, and a flange portion formed around an intermediate portion between the electrode portion and the contacting portion. The flange portion is formed in a diameter larger than that of the apertures and serves as a stopper for retaining the contact tips securely between the tip holder and the anisotropic conductive sheet. Preferably, the contact tips are formed of a rigid material which is harder than the spherical electrodes on IC devices.

In one preferred form of the invention, the contacting portion of the contact tips is formed with a plural number of resilient contacting petals at intervals in the circumferential direction thereof for abutting engagement with peripheral portions of the spherical electrodes of IC devices. In this instance, contacting petals are preferably provided with sharp edges at extreme ends thereof.

In another preferred form of the invention, the contacting portion of the contact tips is formed in a cup-like shape having sharp edges around a concave surface of a smaller radius of curvature as compared with the spherical electrodes of IC devices.

Further, a tip keeper plate which is perforated with a predetermined number of apertures may be provided between the tip holder and the anisotropic conductive sheet. This tip keeper receives in its apertures the electrode portions of the contact tips on the side of the anisotropic conductive sheet, gripping the flange portions of the contact tips securely in position in cooperation with the tip holder.

BRIEF DESCRIPTION OF THE DRAWINGS

The present invention is described more particularly below by way of its preferred embodiments shown in the drawings which, needles to say, are given for illustrative purposes only, so that the present invention should not be construed as being limited to the particular forms shown.

In the accompanying drawings:

FIG. 2 is a schematic side view of the IC tester shown in FIG. 1;

DESCRIPTION OF PREFERRED EMBODIMENTS

Hereafter, the present invention is described more particularly by way of its preferred embodiment. In the following description, IC devices are connected to a test head under temperature control, using a constant temperature bath to heat or cool IC devices which are mounted on a test board. However, it is to be noted that IC devices can be tested without such temperature control.

Figure 1:
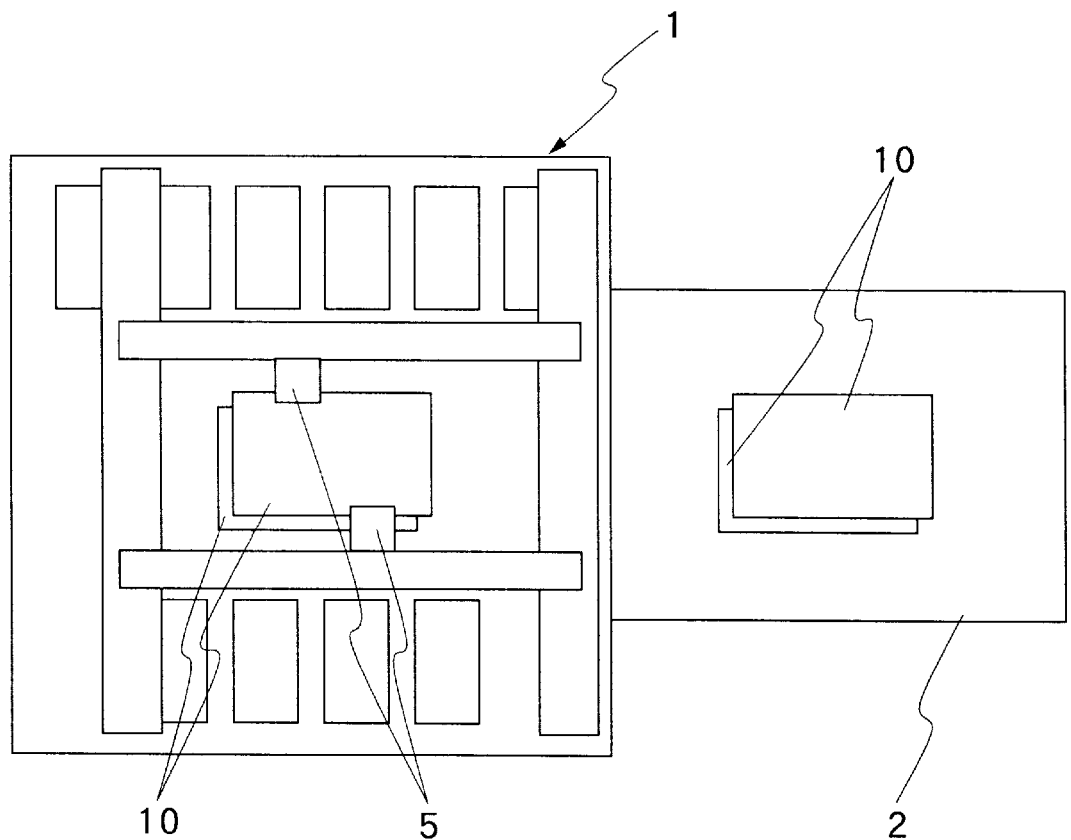
FIG. 1 schematically shows the general layout of a typical IC device tester.
Figure 3:
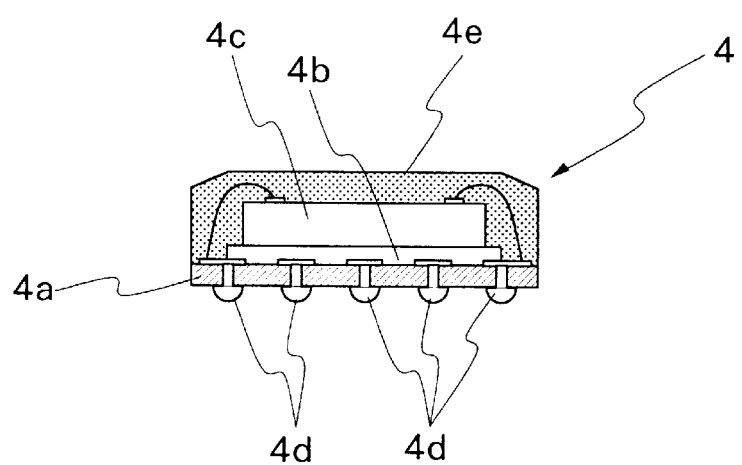
FIG. 3 schematically shows a BGA type package as an example of IC devices to be tested.
Figure 4:
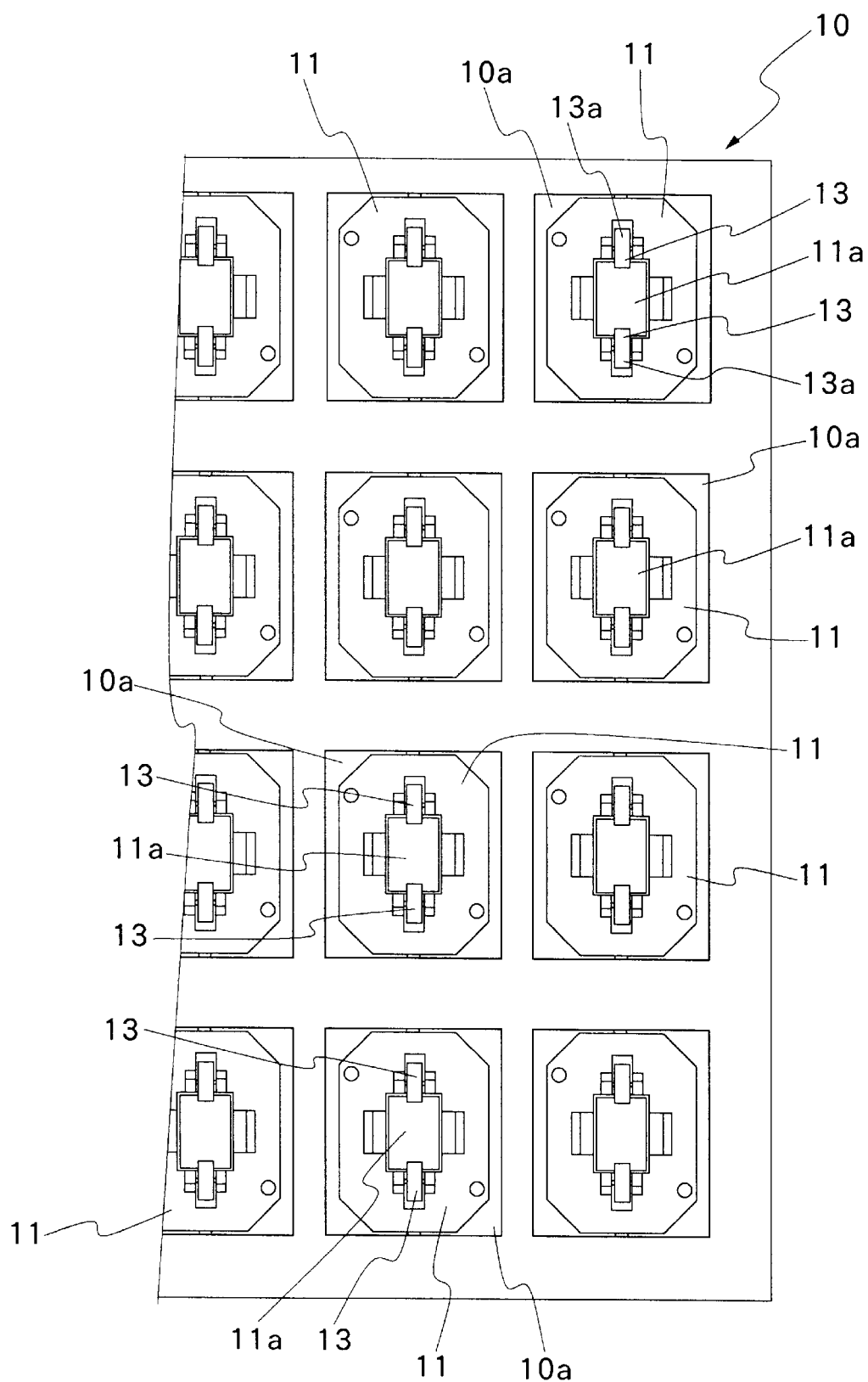
FIG. 4 is a schematic outer view of a test board.

Schematically shown in FIGS. 1 and 2 is the general layout of a typical IC device tester, and in FIG. 3 is an IC device to be tested or measured by the tester.

Referring first to FIGS. 1 and 2, indicated at 1 is a handler, at 2 a constant temperature bath, and at 3 an IC tester. The handler 1 is provided with transfer robots 5 which function to transfer and relocate IC devices, namely, to load and unload IC devices to and from the IC tester. Each transfer robot 5 has suction heads 5a to pick up and transfer IC devices by suction force. By loading and unloading operations by the transfer robots 5, IC devices 4 are loaded on a test board 19 from a large number of IC holder trays of a predetermined shape (not shown) which are set on the handler 1, and, after a test, transferred again onto the IC holder trays.

The use of the test board 10 makes it possible to test a large number of IC devices simultaneously and thus efficiently. The transfer of IC devices 4 between the IC holder trays and the test board 10 is necessitated because normally IC holder trays of simple construction and small jigs are used to accommodate IC devices 4 as much as possible and for convenience in transportation and storage, while the transfer jigs to be used for IC devices under test need to have a mechanism for clamping IC devices 4 in position. Therefore, the test board 10 has a construction as will be described in detail hereinlater.

As soon as a predetermined number of IC devices 4 are set on the test board 10 by operation of the handler 1, the test board 10 is sent to and put in a constant temperature bath 2 by a conveyer or through other transfer path. For a predetermined time period, the test board 10 which carries the IC devices is put in the constant temperature bath 2 which is under strict temperature control, heating or cooling off the IC devices to a preset temperature. For an efficient thermal treatment of IC devices 4, the constant temperature bath 2 is arranged to accommodate a plural number of test boards 10, which are fed forward by a pitch feed means, not shown, along a predetermined path through the constant temperature bath 2 pitch by pitch which substantially corresponds to one cycle of testing operation.

Located in an upper portion of the constant temperature bath 2, where the temperature is controlled most precisely, is a test head 3a to which all of the IC devices 4 on a test board 10 are connected to test their electrical properties by conducting current thereto, when the test board 10 is advanced to an uppermost position in the feed path facing the test head 3a. Upon finishing a test of electrical properties on IC devices 4, the test board 10 which carries theses IC devices is discharged out of the constant temperature bath 2, and returned to the handler section 1 and thereby ejected as tested IC devices 4. Then, in place of ejected IC devices 4, the test board 10 is loaded with fresh IC devices 4. As one test board 10 is discharged, a next test board 10 is lifted up toward the uppermost position or toward the tester 3 while ensuing test boards 10 are lifted up by one pitch from a last position. At the same time, a resh test board 10 is sent into a lowermost set position on the pitch feed mechanism.

The above described operation is repeated to test electrical properties of IC devices 4 successively and continuously. IC devices 4 to be tested are, for example, of the ball grid array type as shown in FIG. 3. The IC device of this type has an LSI chip mounted on an insulating sheet 4b which is in turn bonded on a ceramic substrate 4a. Provided on the back side of the ceramic substrate 4a are an array of spherical electrodes in the form of solder balls 4d serving as electrodes for the IC device 4. These solder balls 4 are wire-bonded to the electrodes of the LSI chip 4c. The LSI chip 4c and wire bonding are sealed in a resin shield 4e. Accordingly, the main body of the IC device 4 is constituted by the LSI chip 4c, ceramic substrate 4a and resin shield 4e, and the electrodes in the form of solder balls 4d are provided in a surface on one side of the packaged main body. In this manner, the IC device 4 has an electrode-forming surface on one side thereof, and a large number of solder ball electrodes 4d are formed in a matrix on that surface. Instead of wire bonding, the connections between the LSI chip 4c and the solder balls 4d may be made by the use of a wiring film or bumps if desired.

The IC device 4, which is fabricated in a construction as described above, is connected to the test head 3a of the IC tester 3 for measurement of its electrical properties or characteristics. The test board 10 which is used for this purpose is provided with a grid-like framework providing a large number of carrier receptacle cells 10a in rows and columns. As described below, a reversible IC carrier 11 is fitted in each one of the carrier receptacle cells 10a of the test board 10.

Figure 5:
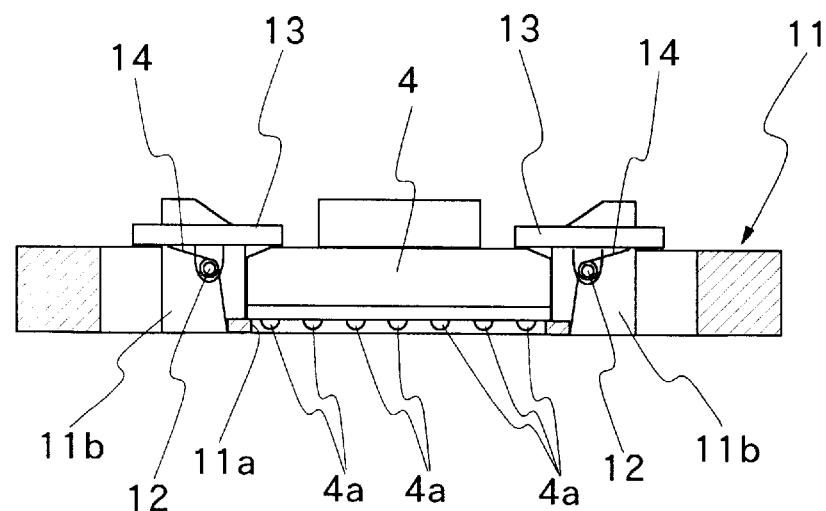
FIG. 5 is a schematic sectional view of a carrier.
Figure 6:
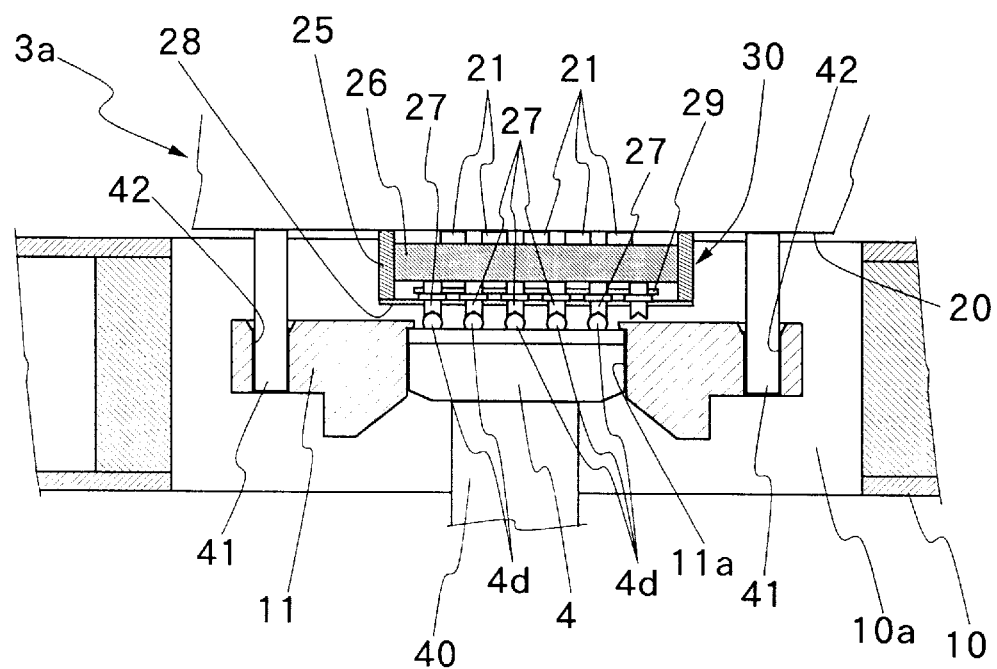
FIG. 6 is a schematic sectional view, showing an IC device which is connected to a test head.

As shown in FIG. 5, each IC carrier 11 is centrally provided with an opening 11a of a size intermediate between the size of the packaged body of the IC device 4 and the surface area in which the solder balls 4d are formed, and a pair of notches 11b which are formed contiguously at the opposite ends of the opening 11a. A shaft 23 is supported across each notch 11b or between its side walls, and a clamp lever 13 is rockably mounted on the shaft 12. Normally, the clamp lever 13 is urged in a device clamping direction by a biasing spring 14. The clamp lever 13 has a rocking extension 13a extended outward of its pivoting point on the shaft 12. Upon depressing the rocking extension 13a, the clamp lever 13 is turned into a receded position away from the IC device 4. Accordingly, when the two clamp levers 13 are turned into the respective receded positions, an IC device 4 can be freely loaded on or unloaded from the carrier 11.

Each IC devices 4 is transferred to and set in a predetermined position on the carrier 11by the suction head 5a. In this respect, in order to allow the suction head 5a to hold the IC device securely without dropping it en route of its transfer, it is desirable for the electrode side with the solder balls 4d to be faced downward or way from the suction head 5a when the IC device 4 is sucked on the latter. On the other hand, since the test head 3a of the IC tester 3 is located in an upper portion of the constant temperature bath 2, it becomes necessary to reverse the sides of the carrier 11 by turning same upside down on the test board 10 before reaching a test position. However, the reversal of the carrier is not necessary in case the suction head 5a can find blank margins around the solder balls 4d in the electrode area which are broad enough for getting a secure grip on the IC device 4. Alternatively, considering that the height of the solder balls 4d is relatively low, if desired, the gripping force of the suction head 5a may be enhanced so that it can securely hold the solder ball electrode side of the IC device 4. In such cases, since the IC devices 4 on the test board 10 can be transferred with the respective solder ball electrode sides facing upward, there is no need for reversing the IC carriers 11 upside down. Further, the reversal of the IC carrier 11 also becomes unnecessary, for example, in case the test head 3a is located in a lower portion of the constant temperature bath 2.

By the use of an IC device test apparatus as outlined above, the electrical properties or characteristics of the IC devices 4 are tested on the test head 3a which is arranged as shown in FIGS. 6 to 9. As clear from FIG. 6, the test head 3a is provided with a socket board 20 which is removably connected to a mother board (not shown) of the test head 3a. Formed on the socket board 20 are a large number of electrode pins 21 which are electrically connected to the mother board by wires 22. Instead of using the wires 22, if desired, the test board 20 may be connected to the mother board through a wiring circuit board or the like.

The electrode pins 21 are received in through holes 23 which are formed in the socket board 20 and provided with contact portions 21a of increased diameter on the lower side of the socket board 20. In order to retain the electrode pins 21 fixedly in the through holes 23 of the socket board 20, solder is applied around the upper ends of the respective electrode pins 21 as indicated by reference numeral 24. Suspended from the socket board 20 is a holder frame 25 for an anisotropic conductive sheet 26, which is comprised of a resilient insulating sheet 26a having suitable properties in electrical insulation, and a large number of fine or thin conductive wires 26b which are embedded in the insulating sheet 26a. In the particular example shown, the fine conductive wires 26b are of gold-plated brass and are all oriented in an angularly inclined direction relative to the faces of the insulating sheet 26a. The opposite ends of all of the fine conductive wires 26b are exposed in the surfaces on the opposite sides of the anisotropic conductive sheet 26. On the front side of the insulating sheet 26a, the exposed end portions of the fine conductive wires 26b are abutted against the contact portions 21a of the electrode pins 21 in such a fashion that each one of the contact portions 21b contacted by a plural number of fine conductive wires 26b.

On the rear side, the insulating sheet 26a is contacted by the solder balls 4d of the IC device 4 under test. Accordingly, the solder balls 4d are electrically connected to the electrodes 22 on the side of the socket board 20 through the fine conductive wires 26b and the contact portions 21a of the electrode pins 21. Since the fine conductive wires 26b are angularly oriented as mentioned above, the respective solder balls 4d of the IC device 4 are brought into contact at positions which are offset by the angle of inclination of the fine conductive wires 26b. The orientation of the fine conductive wires 26b in an angularly inclined direction is for stabilizing the contact with the contact portions 21a of the electrode pins 21 and for precluding the possibilities of the exposed ends of the fine wires 26b piercing or giving damages to a member to be brought into contact therewith.

As described above, the IC devices 4 are connected to the test head 3a through the anisotropic conductive sheet 26 which is set on the test board 20. At such a time, the solder balls 4d which constitute spherical electrodes of the IC devices 4 are connected to the anisotropic conductive sheet 26 not directly but through contact tips 27.

Figure 8:
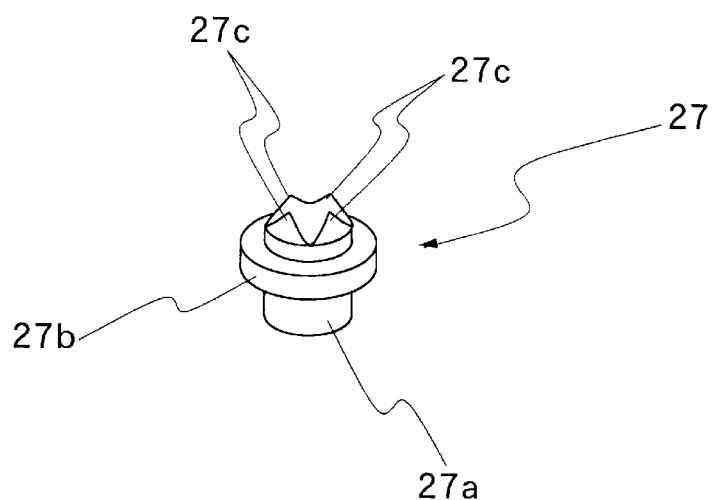
FIG. 8 is a schematic outer view of a contact tip.
Figure 9:
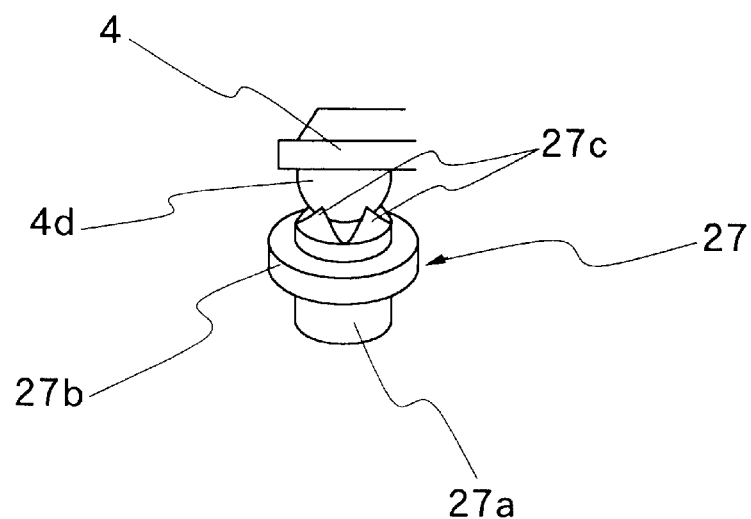
FIG. 9 is a schematic outer view of the contact tip which is held in contact with a solder ball.

In this instance, the contact tips 27 are formed of a rigid conducting material, for example, like beryllium copper (BeCu) and, as seen particularly in FIGS. 8 and 9, each contact tip 27 is provided with a flat-headed stub-like electrode portion 27a, along with a flange portion 27b which is formed contiguously at the other end of the stub portion 27a. Provided on the lower side of the flange portion 27b in the drawings is a contacting portion with a plural number of arcuately curved contacting petals 27c (four contacting petals in the case of the particular example shown). The contacting petals 27c are each arcuately curved toward a sharp-pointed or sharp-edged outer end, from a concave surface which is provided centrally of the contacting portion. It is to be noted that the radius of curvature of the contacting petals 27c is smaller than that of the solder balls 4d.

The contact tips 27, each having the construction as described above, are fitted in a tip holder 28 which is fixed to the holder frame 25. The tip holder 28 is formed of a plate of electrically insulating material and perforated with a predetermined number of apertures 28a each in a size which permits passage therethrough of the contacting petals 27c of the contact tip 27 but not of the flange portion 27b. Further, a tip keeper plate 29 of electrically insulating material is fitted on the stud portions 27a of the contact tips 27 on the tip holder 28. The tip keeper 29 is likewise perforated with a predetermined number of apertures 29a each in a size which permits passage therethrough of the stud portion 27a of the contact tip 27 but not of the flange portion 27b. In addition, the apertures 28a and 29a in the tip holder 28 and the tip keeper 29 are arranged to fit tightly around the contact tips 27 so that the respective contact tips 27 are retained stably between the tip holder 28 and the tip keeper 29.

Figure 7:
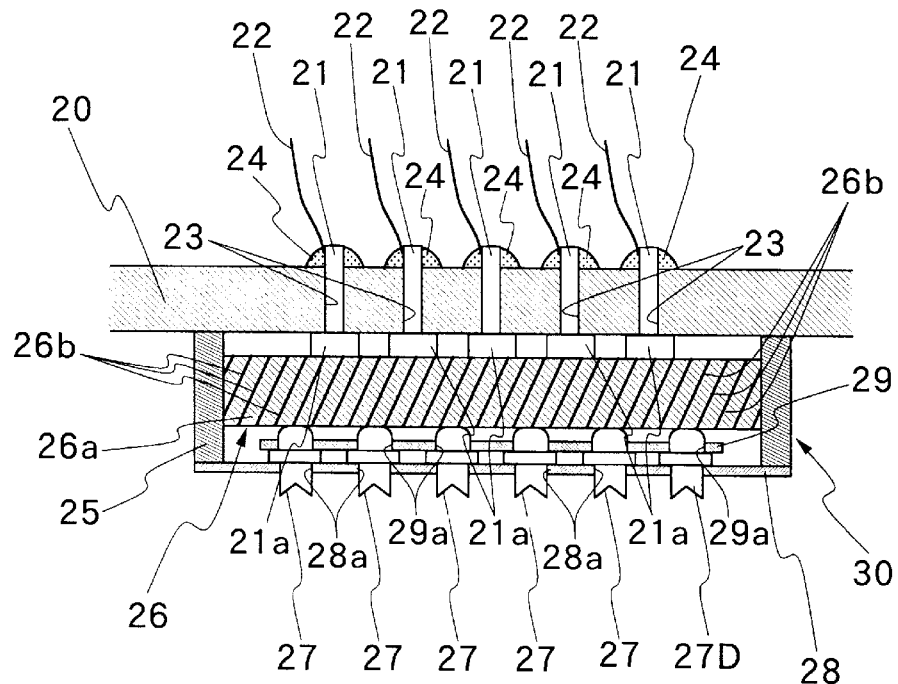
FIG. 7 is a schematic sectional view of a contact unit.

Thus, a contact unit 30 is assembled by fitting and holding the contact tips 27 in and between the tip holder 28 and the tip keeper 29 in the manner as described above. This contact unit 30 is fixed to the holder frame 25 by fixation means like bolts 31. Upon fixing the contact unit 30, a predetermined compressive force is applied to the anisotropic conductive sheet 26. As a consequence, the front and rear sides of the anisotropic conductive sheet 26 are held in pressed contact with the contact portions 21a of the electrode pin 21 and the stud portions 27a of the contact tips 27, respectively, and the electrode pins 21 are electrically connected with the contact tips 27 through the fine conductive wires 26b in the anisotropic conductive sheet 26. Since the fine conductive wires 26b are oriented in an angularly inclined direction across the thickness of the anisotropic conductive sheet 26 as mentioned hereinbefore, the contacting positions of the stud portions 27a of the contact tips 27 on the anisotropic conductive sheet 26 are offset by a predetermined distance relative to the contacting positions 21a of the opposing electrode pins 21. Namely, the pressed contact points on the opposite side of the anisotropic conductive sheet 26 are offset from each other and, so that, for uniform pressure distribution over the entire surfaces of the anisotropic conductive sheet 26, it is desirable to provide a dummy at least at one end of each row of electrode pins 21 or contact tips 27. In FIG. 7, indicated at 27D is a dummy contact tip which is not connected to any electrode pin 21 nor it is contacted by any solder ball 4d at the time of testing IC devices 4.

A set of device contactor is constituted by the contact unit 30 and the anisotropic conductive sheet 26, and a plural number of sets of device contactor are provided on the test board 20 in positions opposing the carriers 11 on the part of the test board 10. A required number of sets of device contactor function as the test head 3a of the IC tester 3. Accordingly, upon connecting the test board 10 to the test head 3a, a large number of IC devices 4 on the respective carriers 11 of the test board 10 are simultaneously connected to the test head 3a for a test of electrical characteristics or properties.

As each test board 10 is located within the constant temperature bath 2 for a predetermined time period, the IC devices 4 on the test board 10 can be heated or cooled off to a preset temperature level prior to a test. Within the constant temperature bath 2, the test board 10 is fed pitch by pitch in an upward direction, and disconnected from the pitch feed means as soon as it reaches an uppermost position. In the particular embodiment shown, each carrier 11 on the test board 10 transfers an IC device 4 with the solder ball side of the IC package faced in the downward direction. Therefore, prior to connection to the test head 3a, it is necessary to turn upside down the test board 10 as a whole or to reverse the sides of all of the carriers 11 within the test board 10.

In the reversed state, the test board 10 is pushed against the test head 3a by a press means 40, whereupon the solder balls 4d of IC devices 4 are abutted against the contacting petals 27c of the contact tips 27. At this time, in order to bring the IC devices 4 into a registered position relative to the contact unit 30, it is desirable to provide positioning pins 41 which are projected downward from the socket board 20 for engagement in positioning holes 42 provided on the part of the carriers 11.

As the whole body of the test board 10 is pushed upward by the press means 40, the solder balls 4d of IC devices 4 are abutted on and contacted with the contacting petals 27c of the contact tips 27. Accordingly, IC devices 4 and electrode pins 21 on the IC tester 3 are maintained in an electrically connected state through the contact tips 27 and the fine conductive wires 26b of the anisotropic conductive sheet 26, and in this state current is conducted to test the IC devices 4. In this connecting stage, although a large number of solder ball electrodes are formed in a matrix on each one of a large number of IC devices 4 which are mounted on the test board 10, it is the contacting petals 27c that are directly contacted by the solder balls 4d, and the respective contacting petals are spread in radially outward directions through resilient deformation upon application of a predetermined pressure, permitting to hold all of the solder balls 4d in contact with the contact tips 27 in a secure and stabilized state by application of a relatively small pressure. The application of a reduced pressing force on the test board 10 during a test is advantageous because it becomes possible to simplify the press means 40 and the contact unit 30.

In this regard, it is not the anisotropic conductive sheet 26 but the contact tips 27 that are contacted by the solder balls 4d. Namely, the contact tips 27 can be deformed or worn out as a result of repeated contacting operations, while the anisotropic conductive sheet 26 which is in pressed contact with the flat ends of the contact tips 27 is free from such impacts as would cause frictional wear or deteriorations thereto and can enjoy a prolonged service life. Although there are possibilities of the contact tips 27 being deformed or worn out after repeated use, damaged or deformed tips can be easily replaced because the respective contact tips 27 are simply gripped between the tip holder 28 and the tip keeper 29 and, if necessary, can be readily removed after detaching the tip keeper 29. Replacements of damaged or deformed contact tips alone will lead to a significant reduction in running cost.

The solder balls 4d are relatively soft and spherical in shape, so that, when mounting an IC device on a wiring board, the apex portions of the respective solder balls 4d function to form secure and stabilized connections to electrodes on the side of the wiring board. For this reason, these apex portions should be kept from damages during an IC test. In this regard, what each one of the solder ball 4d is directly contacted are the four arcuately curved contacting petals 27c of the contact tip 27 which have a radius of curvature smaller than that of the solder balls 4d and therefore can contact the solder ball 4d behind an apex portion thereof and in such a way as to protect the apex portion against damages. Further, should an oxidation film has developed on the surfaces of solder balls 4d in a post-production period, it can be ruptured or pierced by the sharp-pointed outer ends of the contacting petals 27c as the latter are caused to slide along the circumferential surfaces of the solder balls 4d in the contacting stage to form secure and stable electrical connections therebetween. In addition, the contacting petals 27c are abutted against lateral surface portions of the solder balls 4d, so that there is little possibility of apex portions of solder balls 4b being damaged to such a degree as to give rise to any problem in particular when mounting IC devices on wiring circuit boards or the like.

Further, the respective contacting petals 27c are projected away from the tip holder 29, so that, even if the soft solder balls 4d are scraped off by the contacting petals 27c of rigid material, there is no possibility of adjacent contact tips 27 being short circuited by scraped solder debris. Accordingly, the above-described contactor arrangement also contributes to preclude short circuiting across adjacent contact tips 27.

Figure 10:
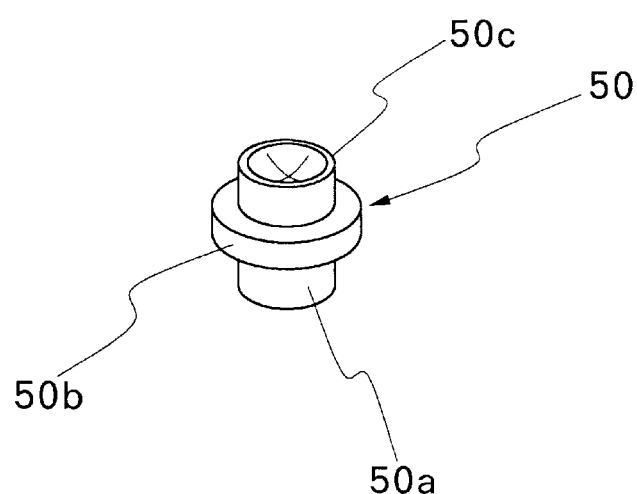
FIG. 10 is a schematic outer view of another contact tip of different construction.

Regarding the contact tip, there may be employed contact tips of a modified construction, for example, as shown in FIG. 10, without the arcuately curved contacting petals 27c as described above. Namely, shown in FIG. 10 is a contact tip 50 which has a flat stud portion 50a and a flange portion 50b similarly to the above-described contact tip 27. In this instance, however, the contact tip 50 has a contact portion 50c of a cup-like shape having circular sharp edges around a concave surface. The concave surface of the contact portion 50c has a smaller radius of curvature than the solder balls 4d. In case the contact tips are arranged in this manner, the solder balls 4d also tend to fit in the contact portions 50c when pressed thereagainst, permitting make connections securely by application of a relatively small pressure.

What is claimed is:

1. An IC device contactor for electrically connecting a large number of spherical electrodes on one side of a substrate of an IC device positioned to undergo electrical testing to an IC tester, said IC device contactor comprising:
   a socket board having a predetermined number of contact points electrically connected to the IC tester;
   an anisotropic conductive sheet formed as a resilient insulating sheet having a multitude of fine conductive wires embedded therein, said fine conductive wires having a predetermined angular orientation across the thickness of said resilient insulating sheet with opposite ends of said fine conductive wires being exposed on opposite front and rear sides of said resilient insulating sheet;

a predetermined number of contact tips made of conducting material, each contact tip having an abutting portion end configured to be placed in electrical contact with the ends of the fine conductive wires exposed on the rear side of the resilient insulating sheet and an opposite end provided with contacting petals configured to provide a resilient electrical connection to a spherical electrode of each IC device positioned to undergo testing; and a tip holder having an insulating plate perforated with a predetermined number of apertures to hold said contact tips detachably in position, said tip holder further being adapted to press the abutting portions of said contact tips into said electrical contact with the ends of the fine conductive wires exposed on the rear side of the resilient insulating sheet and to apply pressure through said resilient insulating sheet to establish resilient contact between the ends of the fine conductive wires exposed on the front side of the resilient insulating sheet and the contact points on said socket board, whereby said contact points on said socket board are electrically connected together with the spherical electrodes of each IC device positioned to undergo testing through the fine conductive wires of the resilient insulating sheet having the ends exposed on the front side thereof in resilient electrical contact with the contact points on the socket board and the ends exposed on the rear side thereof in resilient electrical contact with the abutting portions of the contact tips having contacting petals providing resilient electrical connection to each of said spherical electrodes of each said IC device positioned to undergo testing.

2. The IC device contactor as defined in claim 1, wherein said contact tips are each comprised of an electrode portion (27a) to be abutted against at least one of fine conductive wires in said anisotropic conductive sheet, a contacting portion projected out of an aperture of said tip holder for engagement with a spherical electrode of said IC devices, and a flange portion (27b) formed around an intermediate portion between said electrode portion and said contacting portion, said flange portion being formed in a diameter larger than that of said apertures and serving as a stopper for retaining said contact tips between said tip holder and said anisotropic conductive sheet.

3. The IC device contactor as defined in claim 1, wherein said contact tips are formed of a rigid material harder than said spherical electrodes.

4. The IC device contactor as defined in claim 1, wherein said contacting petals are provided with sharp edges at extreme ends thereof.

5. The IC device contactor as defined in claim 1, wherein said contacting portion of said contact tips is formed in a cup-like shape having sharp edges around a concave surface of a smaller radius of curvature as compared with said spherical electrodes of said IC devices.

6. The IC device contactor as defined in claim 1, wherein said contact tips are each provided with a flange portion at a position intermediate between each abutting portion and each associated contacting petal, said flange portion being gripped between said tip holder and a tip keeper through which said abutting portion passes.

\* \* \* \* \*